(12) United States Patent
Hou

(10) Patent No.: US 7,612,615 B1
(45) Date of Patent: Nov. 3, 2009

(54) DUAL SUPPLY AMPLIFIER

(75) Inventor: Chun-chih Hou, Yujing Township (TW)

(73) Assignee: Mediatek Inc., Hsin-chu (TW)

( * ) Notice: Subject to any disclaimer, the term of this patent is extended or adjusted under 35 U.S.C. 154(b) by 6 days.

(21) Appl. No.: 12/137,727

(22) Filed: Jun. 12, 2008

(51) Int. Cl.
*H03F 3/04* (2006.01)
*H03F 3/45* (2006.01)

(52) U.S. Cl. ............... 330/297; 330/255; 330/310

(58) Field of Classification Search .......... 330/133, 330/253, 255, 297, 310
See application file for complete search history.

(56) References Cited

U.S. PATENT DOCUMENTS 5,289,137 A 2/1994 Nodar et al.
7,030,699 B2 * 4/2006 Richard et al. ............ 330/297
7,061,327 B2 6/2006 Doy
7,061,328 B2 6/2006 Doy
7,183,857 B2 2/2007 Doy
2008/0174372 A1 * 7/2008 Tucker et al. ............. 330/297

* cited by examiner

*Primary Examiner*—Khanh V Nguyen
(74) *Attorney, Agent, or Firm*—Kirton & McConkie; Evan R. Witt

(57) ABSTRACT

A dual supply amplifier without using an inter-stage capacitor is disclosed. The dual supply amplifier has an input stage coupled to a lower supply voltage $V_{DD1}$ for generating a voltage signal V3 proportion to a difference between a pair of inputs. A conversion stage is coupled a higher supply voltage $V_{DD2}$ and a third supply voltage $V_{DD3}$, which can be ground or a negative potential, for generating a signal V1 with reference to $V_{DD2}$ and a signal V2 with reference to $V_{DD3}$. An output stage receives V1 and V2 for generating an output signal $V_o$ with a swing between $V_{DD2}$ and $V_{DD3}$.

12 Claims, 2 Drawing Sheets

– 1 –

DUAL SUPPLY AMPLIFIER

TECHNICAL FIELD OF THE INVENTION

The present invention relates to integrated circuit amplification devices, and more particularly to a dual supply amplifier.

BACKGROUND OF THE INVENTION

Amplifiers are used in various applications. Among these applications, miniaturization is often very important for video and audio applications. In advanced integrated circuits, low supply voltage is used for reducing power consumption. However, for a real-world signal such as a voice signal, the amplitude may be larger than the supply voltage. Accordingly, in addition to a low-V amplification stage, another high-V amplification stage, which is coupled to a higher supply voltage, is required to provide a large signal.

FIG. 1 schematically illustrates a two stage dual supply amplifier, in which a low-V amplification stage 110 is coupled with a high-V amplification stage 140. In an example of a headphone application, a supply voltage $V_{DD1}$ coupled to the low-V amplification stage 110 is about 3.3V, while a supply voltage $V_{DD2}$ coupled to the high-V amplification stage 140 is about 8 to 12V. In such a structure, an inter-stage capacitor 120 is required to isolate the low-V amplification stage 110 and the high-V amplification stage 140. As known in this field, the capacitor occupies a large area in the integrated circuit. Therefore, such a circuit structure is costly and inefficient.

SUMMARY OF THE INVENTION

The objective of the present invention is to provide a dual supply amplifier, in which a low-V stage and a high-V stage are integrated in an integrated circuit without using any inter-stage capacitor.

In accordance with the present invention, the dual supply amplifier comprises an input stage coupled to a lower supply voltage $V_{DD1}$, receiving a pair of inputs $V_{ip}$, $V_{in}$ for generating a voltage signal V3, which is proportion to a difference between the inputs; a conversion stage coupled to a higher supply voltage $V_{DD2}$ and a third supply voltage $V_{DD3}$ for generating a signal V1 with reference to $V_{DD2}$ and a signal V2 with reference to $V_{DD3}$; and an output stage receiving the signals V1 and V2 for generating an output signal $V_o$ with a swing near $V_{DD2}$ and $V_{DD3}$. The third supply voltage $V_{DD3}$ can be a ground potential or a negative potential. For example, $V_{DD3}$ can be approximately equal to the negative quantity of $V_{DD2}$.

BRIEF DESCRIPTION OF THE DRAWINGS

The present invention will be described in detail in conjunction with the appending drawings, in which.

DETAILED DESCRIPTION OF THE INVENTION

Figure 1:
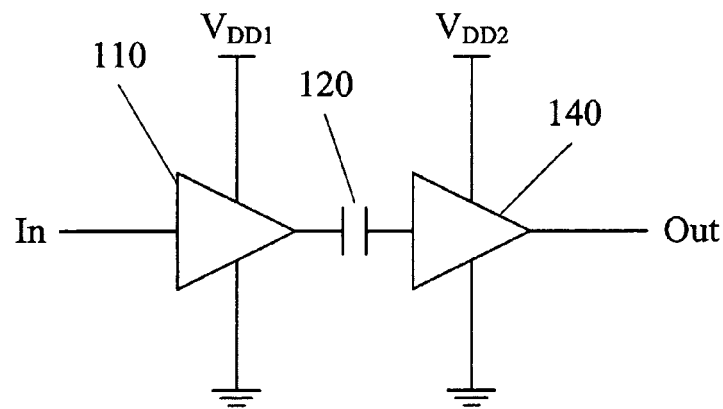
FIG. 1 schematically illustrates a two stage dual supply amplifier of prior art.
Figure 2:
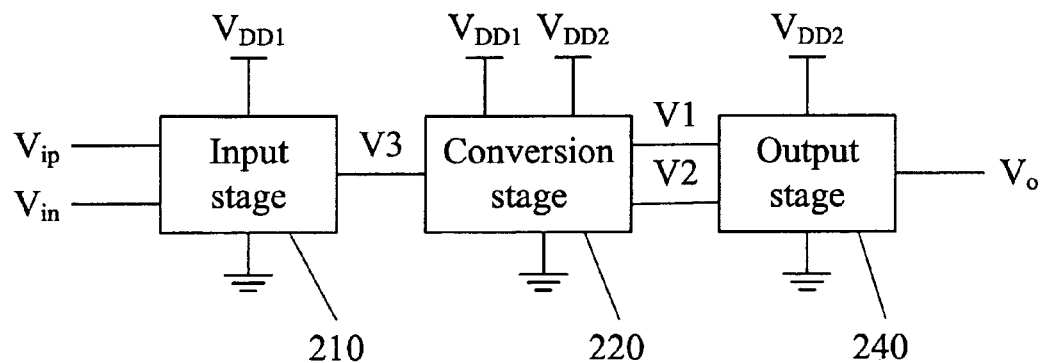
FIG. 2 is a block diagram showing a dual supply amplifier of an embodiment in accordance with the present invention.

FIG. 2 is a block diagram showing a dual supply amplifier of an embodiment in accordance with the present invention. The dual supply amplifier of the present embodiment includes an input stage 210, a conversion stage 220 and an output stage 240. A differential pair of inputs $V_{ip}$ and $V_{in}$ are fed into the input stage 210. The input stage 210 is coupled to a lower supply voltage $V_{DD1}$ and is connected to ground. The input stage 210 receives the input pair $V_{ip}$ and $V_{in}$ and generates a voltage signal V3, of which the amplitude is proportional to the difference between $V_{ip}$ and $V_{in}$, (i.e. $V3 \propto |V_{ip}-V_{in}|$) and has reference to the ground potential. The conversion stage 220 is coupled to the lower supply voltage $V_{DD1}$ and a higher supply voltage $V_{DD2}$ and is grounded. The conversion stage 220 receives the signal V3 from the input stage 210 and generates two voltage signals V1 and V2. The signal V1 has reference to $V_{DD2}$, and the signal V2 has reference to the ground potential. The signals V1 and V2 are fed to the output stage 240, which is coupled to the higher supply voltage $V_{DD2}$ and is grounded. The output stage 240 receives the signals V1 and V2, and generates an output signal $V_o$ with a swing between $V_{DD2}$ and ground potential.

Figure 3:
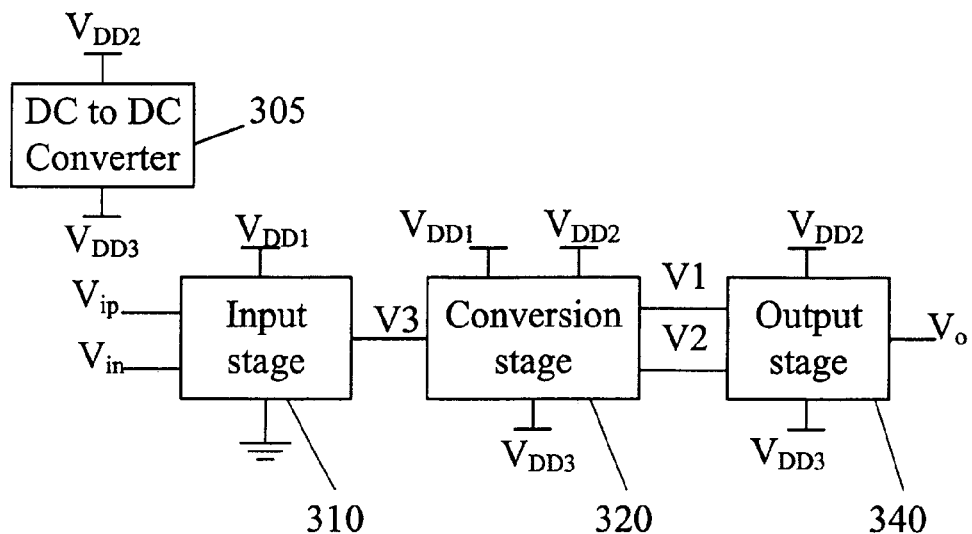
FIG. 3 is a block diagram showing a dual supply amplifier of another embodiment in accordance with the present invention.

FIG. 3 is a block diagram showing a dual supply amplifier of another embodiment in accordance with the present invention. The dual supply amplifier of the present embodiment also includes an input stage 310, a conversion stage 220 and an output stage 240. A differential pair of inputs $V_{ip}$ and $V_{in}$ are fed into the input stage 310. The input stage 310 is coupled to a lower supply voltage $V_{DD1}$ and is connected to ground. The input stage 210 receives the input pair $V_{ip}$ and $V_{in}$ and generates a voltage signal V3, of which the amplitude is proportional to the difference between $V_{ip}$ and $V_{in}$, (i.e. $V3 \propto |V_{ip}-V_{in}|$) and has reference to the ground potential. The conversion stage 220 is coupled to the lower supply voltage $V_{DD1}$ and a higher supply voltage $V_{DD2}$. In comparison with the first embodiment, rather than being connected to ground, the conversion stage 320 is coupled to a third supply voltage $V_{DD3}$. The voltage $V_{DD3}$ is lower than the ground potential, that is, $V_{DD3}$ is a negative potential. The voltage $V_{DD3}$ can be generated by feeding the voltage $V_{DD2}$ to a DC to DC converter 305. The relationship between $V_{DD3}$ and $V_{DD2}$ can be: $V_{DD3}=-aV_{DD2}$, where a is a coefficient, and 0<a. The conversion stage 320 receives the signal V3 from the input stage 310 and generates two voltage signals V1 and V2. The signal V1 has reference to $V_{DD2}$, and the signal V2 has reference to $V_{DD3}$. The signals V1 and V2 are fed to the output stage 340, which is coupled to the higher supply voltage $V_{DD2}$ and the negative voltage $V_{DD3}$. The output stage 340 receives the signals V1 and V2, and generates an output signal $V_o$ with a swing between $V_{DD2}$ and $V_{DD3}$. The dual supply amplifier of this embodiment will be further described in detail with reference to FIG. 4.

Figure 4:
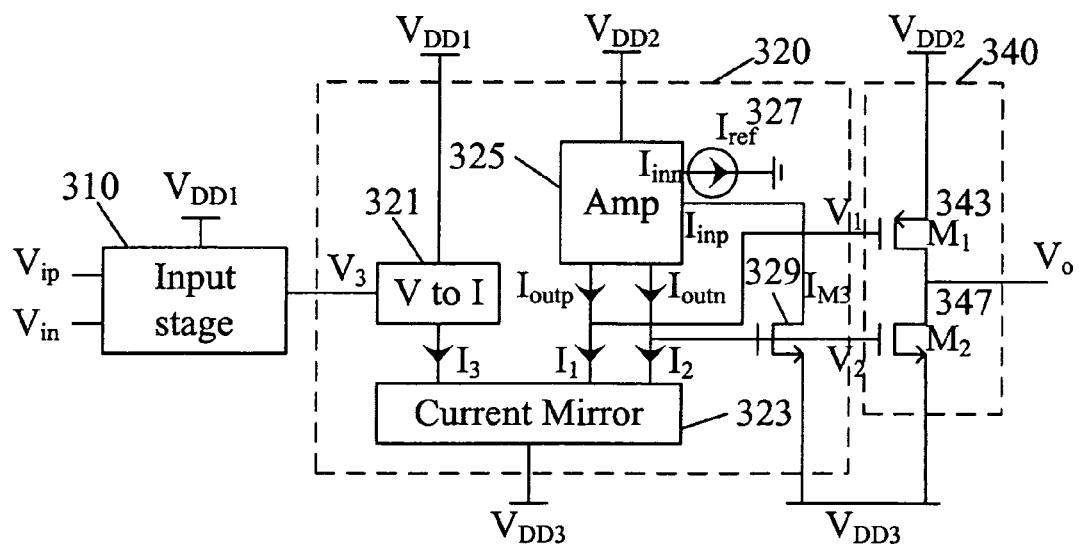
FIG. 4 illustrates an exemplary structure of the dual supply amplifier of FIG. 3.

FIG. 4 illustrates an exemplary structure of the dual supply amplifier of FIG. 3. As shown in this drawing, the conversion stage 320 comprises a V to I converter 321, a current mirror 323, an amplifier 325, a reference current source 327 and a transistor M3 329. The output stage 340 comprises a PMOS transistor M1 343 and an NMOS transistor M2 347. As described, the input stage 310 is to generate the voltage signal V3. The V to I converter 321, which is coupled to the supply voltage $V_{DD1}$, receives the voltage signal V3 and converts the voltage signal V3 into a current signal I3. The current signal I3 is sent to the current mirror 323, which is coupled to $V_{DD3}$. The current mirror 323 provides currents I1 and I2 with magnitudes proportional to I3. The amplifier 325 has an input terminal $I_{inn}$ thereof coupled to the reference current source 327 providing a reference current $I_{ref}$, an input terminal $I_{inp}$ thereof connected to a drain of the transistor M3 329, an output terminal $I_{outp}$ and an output terminal $I_{outn}$. The transistor M3 329 has the drain thereof connected to the input terminal $I_{inp}$, a source thereof coupled to $V_{DD3}$ and a gate thereof coupled with a gate of the transistor M2 347 and coupled to I2 and $I_{outn}$. A source of the transistor M1 343 is coupled to $V_{DD2}$, a gate thereof is coupled to I1 and $I_{outp}$, and a drain thereof is connected with a drain of the transistor M2 347. A source of the transistor M2 347 is coupled to $V_{DD3}$. Accordingly, V1 is dependent on I1 and $I_{outp}$, V2 is dependent on I2 and $I_{outn}$.

The transistor M3 329 senses a DC current of the transistor M2 347. The amplifier 325 compares a current $I_{M3}$ of the transistor M3 with the reference current $I_{ref}$ provided by the current source 327. The amplifier 325 provides the differential output currents $I_{outp}$ and $I_{outn}$ such that V1 and V2 can have the amplitudes to make each of the transistors M1 343 and M2 347 maintains at a biasing point. When the transistors M1 343 and M2 347 maintain at the biasing points thereof, DC currents of the transistors M1 343 and M2 347 are proportional to $I_{ref}$. When $I_{M3}$ is greater than $I_{ref}$, the output current $I_{outp}$ of the amplifier 325 is greater than $I_{outn}$, so as to pull up V1 and pull down V2. By such a feedback scheme, V1 and V2 can be properly adjusted.

AC magnitudes of I1 and I2 respectively depend on $(V_{ip}-V_{in})$. V1 has reference to $V_{DD2}$ and is to control the AC current of the transistor M1 343. The AC voltage of the transistor M1 343 should be the voltage drop of $V_{DD2}$-V1. V2 has reference to $V_{DD3}$ and is to control the AC current of the transistor M2 347. The AC voltage of the transistor M2 347 should be the voltage drop of V2-$V_{DD3}$. The output signal $V_o$ has a swing having reference to V1 and V2. Since V1 and V2 both have reference to $(V_{ip}-V_{in})$, thus an AC magnitude of $V_o$ depends on $(V_{ip}-V_{in})$. Accordingly, the dual supply amplifier in accordance with the present embodiment provides the output signal $V_o$ with a swing near $V_{DD2}$ and $V_{DD3}$.

A DC magnitude of the output $V_o$ can be at any point between $V_{DD2}$ and $V_{DD3}$. The DC magnitude of the output $V_o$ can be near the ground potential when $V_{DD3}$ is near $-V_{DD2}$, and so that the dual supply amplifier of the present embodiment can be directly connected to a headphone. Otherwise, the dual supply amplifier of the present embodiment is able to be connected to the headphone via a capacitor (not shown) at the output node of the dual supply amplifier, so is the dual supply amplifier of FIG. 2.

Preferably, each of the transistors M1, M2 and M3 used in the conversion stage and output stage is implemented by an MOSFET whose drain can sustain a voltage drop more than twice of $V_{DD1}$.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A dual supply amplifier comprising:
   an input stage coupled to a first supply voltage, the input stage receiving a pair of input signals for generating a first voltage signal with a magnitude proportional to a difference of the pair of input signals;
   a conversion stage coupled to the first supply voltage, a second supply voltage and a third supply voltage, the third supply voltage being lower than the first and second supply voltages, the conversion stage receiving the first voltage signal from the input stage for generating a second voltage signal with reference to the second supply voltage and a third voltage signal with reference to the third supply voltage; and
   an output stage coupled to the second supply voltage and the third supply voltage, the output stage receiving the second voltage signal and the third voltage signal for generating an output signal with a swing between the second supply voltage and the third supply voltage.

2. The dual supply amplifier of claim 1, wherein the third supply voltage is a ground potential.

3. The dual supply amplifier of claim 2, wherein the output stage is coupled to a capacitor at an output node.

4. The dual supply amplifier of claim 1, wherein the third supply voltage is a negative potential.

5. The dual supply amplifier of claim 4, wherein the output stage is capable of directly connecting to a headphone.

6. The dual supply amplifier of claim 4, wherein the third supply voltage is generated by a DC-to-DC converter.

7. The dual supply amplifier of claim 1, wherein the conversion stage comprises a V to I converter coupled to the first supply voltage for converting the first voltage signal into a first current signal with a magnitude proportional to the first voltage signal, a current mirror coupled to the third supply voltage, receiving the first current signal for providing a second current signal and a third current signal with magnitudes proportional to the first current signal, and an amplifier coupled to the second supply voltage for providing a pair of differential output currents, the differential output currents and the second and third current signals are used to determine the magnitudes of the second and third voltage signals.

8. The dual supply amplifier of claim 7, wherein the conversion stage further has a first transistor for sensing the third voltage signal and providing a fourth current signal to be compared with a reference current by the amplifier, and the amplifier adjusts the differential output currents according to the comparison result so as to adjust the second and third voltage signals.

9. The dual supply amplifier of claim 8, wherein the first transistor is implemented by a MOSFET with a drain be able to sustain a voltage drop more than twice of the first supply voltage.

10. The dual supply amplifier of claim 1, wherein the output stage comprises a second transistor coupled to the second supply voltage and receiving the second voltage signal at a control terminal thereof and a third transistor coupled to the third supply voltage and receiving the third voltage signal at a control terminal thereof for generating the output signal according to the second supply voltage, the third supply voltage, the second and third voltage signals.

11. The dual supply amplifier of claim 10, wherein each of the second and third transistors is implemented by a MOSFET with a drain be able to sustain a voltage drop more than twice of the first supply voltage.

12. The dual supply amplifier of claim 10, wherein the second transistor is implemented by a PMOS and the third transistor is implemented by an NMOS.

* * * * *